United States Patent [19]

Herron et al.

[11] Patent Number: 4,776,978
[45] Date of Patent: Oct. 11, 1988

[54] METHOD OF CONTROLLING THE SINTERING OF METAL PARTICLES

[75] Inventors: Lester W. Herron, Hopewell Junction; Raj N. Master, Wappingers Falls; Robert W. Nufer, Hopewell Junction, all of N.Y.

[73] Assignee: International Business Machines Corporation, Armonk, N.Y.

[21] Appl. No.: 42,922

[22] Filed: Apr. 27, 1987

Related U.S. Application Data

[62] Division of Ser. No. 604,259, Apr. 26, 1984, Pat. No. 4,671,928.

[51] Int. Cl.$^4$ .............................................. H01B 1/06
[52] U.S. Cl. ..................... 252/512; 252/513; 252/514; 252/500; 427/220; 427/221; 428/407
[58] Field of Search .................... 252/512, 513, 514; 427/96, 97, 22 D, 221; 428/407; 419/10, 37; 156/89; 264/125

[56] References Cited

U.S. PATENT DOCUMENTS

| | | | |
|---|---|---|---|
| 4,055,615 | 10/1977 | Ikeda | 419/11 |
| 4,289,719 | 9/1981 | McIntosh et al. | 264/61 |
| 4,431,449 | 2/1984 | Dillon et al. | 419/36 |
| 4,434,134 | 2/1984 | Danow et al. | 419/36 |
| 4,483,905 | 11/1984 | Engström | 419/37 |

Primary Examiner—Josephine Barr
Attorney, Agent, or Firm—T. Rao Coca

[57] ABSTRACT

Sintering of metal particles at their normal sintering temperature is inhibited by coating the metal particles with an organic material such as polyvinyl butyral, polyvinyl formvar, polyvinyl alcohol, polyacrylonitrile epoxies, urethanes and cross-linked polyvinyl butyral. The organic coating serves as a barrier preventing physical contact between metal particles during the initial phase of the sintering cycle and degrades into a carbonaceous coating followed by volatilization during the intermediate phase of the cycle permitting coalescence of the metal particles into a dense mass along with the coalescence of the glass-ceramic particles. Co-sintering of the metal particles and the glass-ceramic particles with the aid of the organic coating results in a hermetic multi-layer glass ceramic substrate free of dimensional stability problems without deleteriously affecting the electrical conductivity of the metal conductor pattern.

7 Claims, 3 Drawing Sheets

METHOD OF CONTROLLING THE SINTERING OF METAL PARTICLES

This application is a division of 06/604,259 filed 4-26-84 now U.S. Pat. No. 4,671,928.

BACKGROUND OF THE INVENTION

1. Field of the Invention

This invention relates to a method of controlling the sintering temperature of metal particles. More particularly, this invention relates to a method of reducing the difference between the sintering onset temperature of the metal particles constituting a thick film conductor paste formed on a ceramic green sheet and the sintering onset temperature of the ceramic particles constituting the green sheet by preventing the sintering of the metal particles until a temperature close to the sintering temperature of the ceramic particles is reached.

The terms "sintering temperature" and "sintering onset temperature" are herein used interchangeably. They refer to the lowest temperature at which agglomeration of the particles of a given medium occurs by thermal means.

2. Description of the Prior Art

In the conventional technique of forming a multilayer glass-ceramic substrate carrier for mounting of semiconductor integrated circuit chips thereon, (unfired) ceramic sheets, referred to as green sheets, are prepared from a composition consisting of a high melting point ceramic powdered material such as aluminum oxide, titanium oxide, barium oxide or calcium oxide, a lower melting point glass material such as lead silicate, borosilicate, magnesium aluminum silicate or soda-lime glass or a combination thereof, an organic resin binder material such as polyvinyl butyral, vinylchloride acetate co-polymer, polyvinyl alcohol, polyvinyl chloride, polystyrene or polyethylene, a plasticizer such as dibutyl phthalate, butyl benzyl phthalate or dioctylphthalate and a solvent such as trichloro ethylene, methyl ethyl ketone, methylalcohol, cyclohexanone or toluene. Then, interlevel via holes at predetermined locations are punched in each green sheet followed by forming on the surface of each sheet a thick film electrical circuit pattern and filling the via holes thereon using a suitable conductive paste. The conductive paste is typically a metallizing paste of copper or another non-refractory metal wherein the predominant component is the metal. The green sheets are then stacked upon one another, in registry, in a laminating press ensuring signal path integrity from layer to layer after the stacking operation.

The laminated assembly is then subjected to a sintering cycle involving relatively high sintering temperatures and long periods of time to volatilize the organic binding material and subsequently reform the ceramic particles into a dense and substantially impervious multilayer ceramic substrate. A typical sintering cycle, which is disclosed in U.S. Pat. No. 4,234,367 issued to L. W. Herron, R. N. Master and R. R. Tummala and assigned to IBM Corporation, the present assignee, is illustrated in FIG. 1. Referring to FIG. 1, the process consists of initially heating the laminated assembly in a non-oxidizing ambient such as pure nitrogen or nitrogen plus hydrogen at a slow rate until a carbon oxidation temperature of about 780° C. is reached. Upon reaching the burn-out temperature the ambient is switched to an ambient of $H_2/H_2O$ at a volume ratio of about $10^{-4}$ and these conditions are maintained for about 6-8 hours. During this intermediate phase of the sintering cycle the hydrogen gas prevents oxidation of (i.e., serves as a reducing agent for) the metal particles constituting the thick conductor film and the water vapor enhances oxidation of the carbon and promotes the burn-out of the polymeric binder materials. In the final phase of the sintering cycle, the $H_2/H_2O$ ambient is changed to nitrogen, with about 0.5-2.0 hour hold to remove entrapped or dissolved water with subsequent heating to a temperature of about 930-1000° C. with about a 2 hour hold at this temperature for sintering and crystallization of the glass and ceramic particles constituting the green sheets.

To more fully delve into the sintering scenario of the conventional process, due to the relatively low melting point of the metal constituting the thick film conductor pattern in comparison with the melting points of glass and ceramic constituents of the green sheets, the metal particles undergo sintering with attendant shrinkage of the thick film pattern during the initial phase of the sintering cycle whereas the ceramic and glass particles undergo sintering during the intermediate and final phases of the sintering cycle along with their characteristic shrinkage. To explain the mechanism by which the metal particles will undergo sintering, attention is focused on a pair of metal particles in physical contact with each other at a low, pre-sintering temperature. As the temperature is raised, the metal particles will initially form a neck at their mutual contact point due to inter-particle diffusion. During this neck forming stage, there will be no shrinkage in the volume of the particles. As the temperature is raised further, however, the material from each particle will be transported into the other via the neck with eventual coalescence of the two particles into a single mass of a reduced dimension. The ceramic and glass particles constituting the green sheets will undergo sintering in a similar manner with a different shrinkage factor than the metal.

A typical relative percentage shrinkage of metal and ceramic materials due to sintering is illustrated in FIG. 2. As shown in FIG. 2, not only are the sintering onset temperatures of metal and ceramic different giving rise to a sintering temperature differential $\Delta T$, but also the sintering rates of these materials are quite diverse. $\Delta S$ is the difference in total shrinkage between the metal and ceramic materials. As a result of this disparity in shrinkage rates, the multilayer ceramic substrate is prone to distortion introducing dimensional stability problems, i.e. proper contact of interlevel conductors is jeopardized. Another problem due to the shrinkage is that the locations of the top surface pads are not predictable with sufficient accuracy for high-speed automatic probing necessitating individually determining these locations which is not cost-effective in a high-volume manufacturing environment. Yet another problem due to the relatively low temperature sintering of the metal particles is the formation of one or more ceramic-metal separations within the interlevel via holes due to pulling away of the metal from the walls of the ceramic via hole. This is illustrated in FIG. 3 which shows a fired unitary ceramic structure 10 having two via holes 11 and 12 containing interlevel conductors 13 and 14, respectively. The separations in the via holes due to the pulling away of the metal discussed hereinabove are designated by numerals 15 and 16. As a result of these separations in the interlevel via holes, the multilayer ceramic package will be non-hermetic and is susceptible to penetration of chemical solutions and other hostile environments.

One method of delaying the sintering onset of the metal particles until at least the intermediate phase of the sintering cycle is to intersperse the metal particles in the thick film with a high melting point material such as molybdenum or aluminum oxide. However, this technique, among other disadvantages, undesirably lowers the conductivity of the conductor pattern, particularly when copper is utilized for the pattern, since a high densification of the metal cannot be achieved.

It is an object of the invention to reduce the difference in sintering temperatures of metal particles and glass-ceramic particles in the fabrication of a multilayer ceramic substrate without deleteriously affecting the electrical conductivity of the metal conductors.

It is another object of the invention to prevent the sintering of metal particles constituting the thick film conductor paste in the fabrication of a multilayer ceramic substrate until a high temperature close to the sintering temperature of the glass-ceramic particles is reached.

These and other objects of the invention will be apparent from the following description.

SUMMARY OF THE INVENTION

Disclosed is a method of preventing the sintering of metal particles by forming a barrier between the particles. Sintering is prevented until the barrier is removed typically by increasing the temperature in a suitable ambient. The barrier is formed by coating the metal particles with a polymeric material such as polyvinyl butyral, polyvinyl formvar, polyvinyl alcohol, polyacrylonitrile, epoxies, urethanes, or cross-linked polyvinyl butyral. When subjected to relatively low temperatures using a non-oxidizing ambient the organic coating degrades due to the thermal energy supplied leaving a carbonaceous residue. The residual carbon continues to act as a barrier preventing sintering of the metal particles until subjected to oxidation and further heating at which point it volatilizes permitting a coalescence of the metal particles into a dense mass. Metals that can be conveniently inhibited from low temperature sintering by this method include copper, nickel, palladium, platinum, silver and gold and their alloys.

In a specific implementation of the invention, a dimensionally reproducible multilayer ceramic substrate may be fabricated by coating the powdered metal particles with an organic polymer material such as polyvinyl butyral before forming a metallized paste therefrom. Using the metallized paste, via hole filling and circuit patterning on the ceramic green sheets is accomplished followed by the usual stacking and laminating of the green sheets. The structure is then subjected to a conventional sintering cycle. Due to effective prevention of physical contact between the metal particles by the organic coating, the metal particles are inhibited from sintering even at temperatures exceeding their normal sintering temperature. As the firing temperature increases the organic coating slowly decomposes into a residual carbonaceous coating. The carbonaceous coating continues to physically prevent the contact between metal particles until introduction of an oxidizing environment at which point the residual carbon oxidizes into gaseous byproducts permitting sintering of the metal particles along with the initiation of sintering of the glass-ceramic particles. Since the metal particles and the glass-ceramic particles sinter essentially simultaneously, the disparity between the shrinkage of the metal circuit pattern and the glass-ceramic structure will be minimal. Since the organic coating over the metal particles is fully oxidized excellent densification of the metal resulting in a high conductivity circuit pattern is achieved.

DETAILED DESCRIPTION OF THE PREFERRED EMBODIMENT

It was discovered, in accordance with the invention, that sintering of low melting point metal particles can be inhibited by forming a barrier between the metal particles until removal of the barrier typically by subjecting the powdered material to high temperatures and appropriate ambient conditions. Metals that can be inhibited from sintering at their normal sintering temperature by this method include such high electrical conductivity metals as copper, nickel, palladium, platinum, gold and silver as well as their alloys. Examples of the barrier that prevents low temperature sintering of the conductive material include organic polymeric materials such as polyvinyl butyral, polyvinyl alcohol, polyvinyl formvar, polyacrylonitrile, epoxies, urethanes and cross-linked polyvinyl butyral.

The barrier may be formed by coating the metal particles with the specified polymeric material. One method of accomplishing the coating is starting with the metal in a powdered form, the powder is immersed in a solution consisting of the polymeric material and an evaporable solvent such as methyl alcohol. The powder is then removed from the solution and subjected to a drying process upon which a thin layer of the polymeric material will remain on the powder particles. This barrier also serves to retard oxidation of the powder during storage.

To form thick film conductors, which is the context in which the present invention is perceived to be most applicable, the polymeric material-clad metal particles are combined in a conventional manner with suitable binders and vehicles forming a reactively bonded metallizing paste characterized by a low resistivity after sintering.

The vehicles and binders chosen must be those which may be volatilized at or below the sintering temperature of the ceramic so that only residual metallization remains after the process is completed. The proportion of the organic and inorganic materials in the paste are adjusted to provide the proper rheology necessary for thick film screen printing.

One suitable vehicle in which the coated particles may be dispersed to form a paste thereof is a composition consisting of 20% N-50 ethyl cellulose and 80% butyl carbitol acetate which is disclosed in U.S. Pat. No. 4,109,377 issued to L. A. Blazick and L. F. Miller and assigned to the present assignee. Reference is also made to this patent for details of preparing a metallizing paste using the conventional thick film milling processes.

The coated particles can also be formed into a paste by using commercially available techniques.

Figure 1:
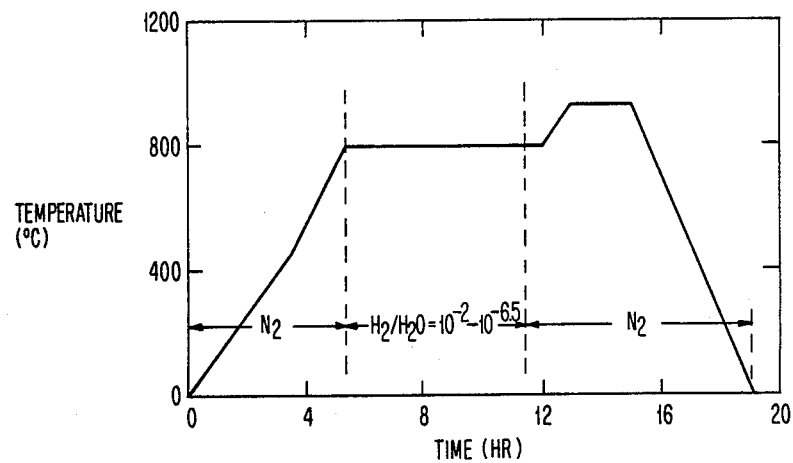
FIG. 1 is a graph showing a conventional firing schedule used to drive off polymeric binders and to sinter the glass-ceramic and metal particles together in the fabrication of a multilayer ceramic substrate.
Figure 2:
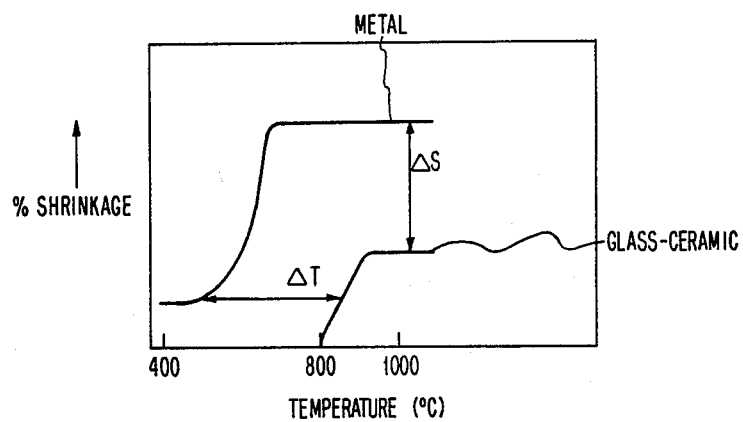
FIG. 2 is a graph showing the conventional shrinkage of metal and ceramic components in a multilayer ceramic substrate when subjected to the sintering schedule of FIG. 1.
Figure 3:
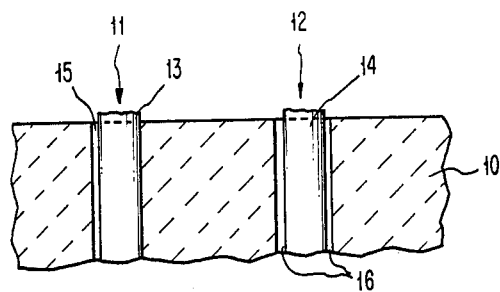
FIG. 3 illustrates via structures in a multilayer ceramic substrate in accordance with the prior art.

The metallizing paste is then deposited on a substrate material typically, a ceramic green sheet, by a conventional technique such as screen-printing, spraying, dipping, etc., in a desired pattern. Thereafter, the structure is fired to drive off the binders and to sinter the ceramic and metal particulates together. One suitable firing schedule which enables co-sintering of the ceramic and metal particles at essentially the same temperature, namely the sintering temperature of the ceramic, is heating the structure, as illustrated in FIG. 1, in a non-oxidizing ambient such as hydrogen or nitrogen or a combination thereof to a temperature of about 720°–800° C. exceeding the normal sintering temperature of the metal particles which is in the range of about 300°–600° C. At these high temperatures, however, the polymeric coating over the metal particles transforms into a carbonaceous material.

Figure 4:
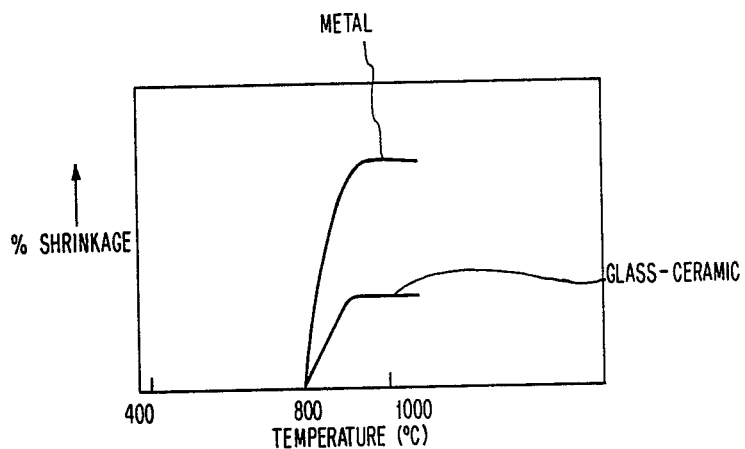
FIG. 4 is the counterpart of the FIG. 3 graph showing the controlled sintering of the metal and ceramic components in accordance with the invention.

Since the metal particles are effectively encased in the carbonaceous material, metal sintering is inhibited even at these high temperatures as illustrated in FIG. 4. Burn-out of the carbonaceous material occurs when an oxidizing ambient of hydrogen and $H_2O$ in the ratio of $H_2/H_2O$ of about $10^{-2}$ to $10^{-6.5}$ is introduced. Thereafter an inert nitrogen plus hydrogen atmosphere is substituted for the oxidizing ambient and the structure is heated to a higher temperature of about 930°–1000° C. to complete sintering and crystallization of the glass-ceramic body.

In accordance with the teachings of the invention, a wide variety of structures can be fabricated which utilize co-sintering of a high sintering and maturing temperature glass-ceramic substrate material and a low sintering temperature thick film metal conductor forming composition formed on the substrate in their fabrication process. However, the invention will be described in reference to the fabrication of a multilayer ceramic substrate. More particularly, the invention will be described with reference to formation of a sintered glass-ceramic substrate containing multi-level, interconnected thick-film circuit patterns of copper-based conductors. At the outset a copper paste for forming the required circuit patterns is prepared starting with a commercially available copper powder. An alternative approach is start with a solution of a complex salt of copper, such as copper chloride, copper bromide, copper sulphate or copper nitrate and accomplish a reducing treatment using suitable catalysts, etc., to precipitate the copper out from the solution. The copper powder is then immersed in a solution of an organic polymeric material such as polyvinyl butyral and an evaporable methyl alcohol solvent followed by subjecting the copper powder to a drying treatment to evaporate the solvent and leave a polyvinyl butyral coating over the individual copper particles in the powder. Spray drying is another example of the drying treatment. The weight percent of the polymeric coating on the copper particles is small, typically about 0.3–0.6. The coated copper particles are subsequently formed into a conductor paste by combining with suitable binders, plasticizers, solvents, etc. In one example, the coated copper particles are mixed with binder solvents such as those disclosed in the aforementioned U.S. patent to Blazick et al to form a copper paste having a desired viscosity.

The copper paste formed in this fashion is deposited by, for example, screen printing in patterns on required green sheets which form the component layers of the desired multilevel structure. The via or feed-through holes punched in the green sheets for interlevel connection in the ultimate structure are also filled with the copper paste. Following stacking and laminating the green sheets the laminate is fired to decompose the polymeric coating on the copper particles and other binders in the green sheets and to sinter the ceramic and metal particulates together using the sintering cycle depicted in FIG. 1.

Due to its inherently unique degradation capablility, the polyvinyl butyral which is present not only in the green sheet material but also in the coating over the copper particles degenerates at a steady rate at the low temperature and non-oxidizing ambient conditions corresponding to the initial phase of the sintering cycle (FIG. 1). Specifically, the predominant polyvinyl butyral degradation into carbon residue takes place below about 500° C. followed by further relatively slow degradation thereafter. Since the carbonaceous coating formed over the copper particles due to polyvinyl butyral degradation will prevent establishment of a contact point between adjacent copper particles sintering of the copper particles will be inhibited. This physical separation between the copper particles will continue until substitution of the $H_2/H_2O$ oxidizing ambient in place of the original non-oxidizing ambient at a desired temperature of about 780° C. Switching to the oxidizing environment causes burn-off of the carbonaceous coating over the ceramic and copper particles. Once the carbon coating is oxidized and volatilized into gaseous byproducts, the copper particles physically come in contact with each other followed by the interparticle neck formation and ultimate coalescence in accordance with the normal sintering mechanism. This sintering atmosphere is maintained until a complete burn-off of not only the carbon residue over the copper particles but also that present in the green sheet material. Switching back to a non-oxidizing environment and further elevation of the temperature to the crystallization temperature of the glass particles in the green sheets will complete the glass particle coalesence and crystallization into a glass-ceramic structure.

Figure 5:
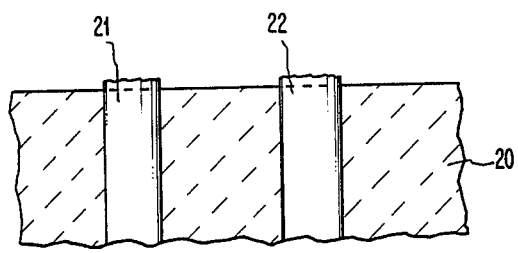
FIG. 5 illustrates via structures in a multilayer ceramic substrate in accordance with the invention.

In this manner the copper particles in the conductor paste and the glass-ceramic particles in the green sheet material sinter essentially simultaneously with minimal disparity between the shrinkage factors of the final copper conductor pattern and the glass-ceramic structure. A benefit resulting from this is that the ceramic walls corresponding to the interlevel via holes closely embrace the metal conductor therein without leaving any room for formation of undesirable ceramic-metal separations along the walls. This feature is illustrated in FIG. 5 where 20 designates a unitary ceramic substrate and 21 and 22 are metal conductors formed in via holes therein. Since the organic coating is fully oxidized into gaseous byproducts excellent copper densification is achieved resulting in a copper pattern having a high conductivity in the range 2–3 microohm-cm.

Figure 6:
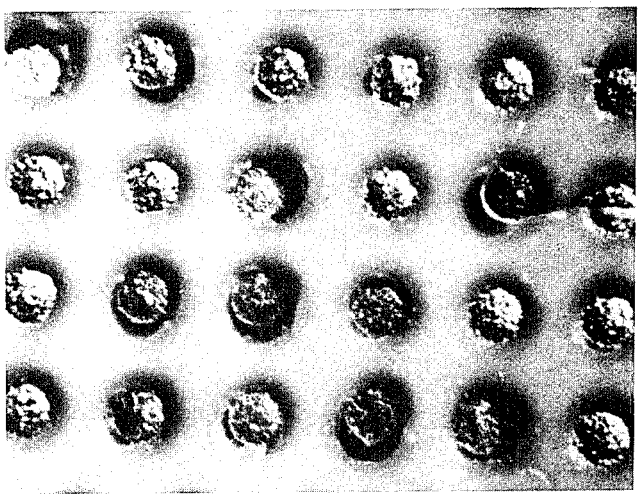
FIGS. 6 and 7 are micrographics of the via structures corresponding to those illustrated in FIGS. 3 and 5, respectively.
Figure 7:
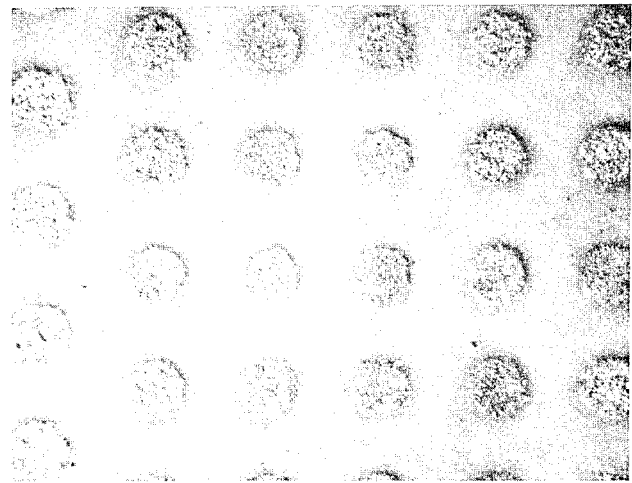

The above discussed total absence of formation of openings or gaps between the walls of the ceramic interlevel via holes and the metal conductors therein is dramatically displayed in FIG. 7 which is a micrograph in a view taken from the top of a glass-ceramic substrate having a matrix of interlevel via holes each accommodating a copper conductor therein. As seen from FIG. 7, the ceramic is formed snugly around the copper conductors. This improved result of the invention becomes particularly apparent when compared with the ceramic structure displayed in FIG. 6 which was fabricated without utilizing the barrier layer between the copper particles taught by the invention.

While the invention has been particularly shown with respect to the preferred embodiment thereof, it will be understood by those skilled in the art that various changes in form and detail may be made therein without departing from the spirit and scope of the invention.

What is claimed is:

1. A conductor forming composition suitable for forming thick film conductors in a multilayer ceramic substrate for an integrated circuit device package by subjecting said composition to a sintering cycle, said composition comprising:
   a base of low melting point and high electrical conductivity metal particles; and
   an organic coating over said metal particles capable of decomposing in a non-oxidizing environment at a low temperature corresponding to the initial phase of said sintering cycle and thereby providing a carbonaceous residue for preventing sintering of the metal particles until subjected to an oxidizing environment at a high temperature corresponding to the intermediate phase of the sintering cycle.

2. The composition as recited in claim 1 wherein said organic coating is selected from a group consisting of polyvinyl butyral, polyvinyl formvar, polyvinyl alcohol, polyacrylonitrile, epoxies, urethanes and crosslinked polyvinyl butyral.

3. The composition as recited in claim 2 wherein said metal is selected from a group consisting of copper, nickel, platinum, palladium, silver and gold and alloys thereof.

4. A conductor forming composition suitable for forming a conductor on a ceramic substrate by subjecting said composition to a sintering cycle, said composition comprising copper particle base and polyvinyl butyral coating over said copper particle.

5. The composition as recited in claim 4 wherein the polyvinyl butyral is about 0.3–0.6 wt. percent of said copper particle.

6. A conductor forming composition suitable for forming a thick film conductor on a ceramic substrate by subjecting said composition to a sintering cycle, said composition comprising:
   a particle base of a low melting point and high electrical conductivity material selected from the group consisting of copper, nickel, platinum, palladium, silver, gold and alloys thereof; and
   an organic coating over said particles, said coating being selected from a group consisting of polyvinyl butyral, polyvinyl formvar, polyvinyl alcohol, polyacrylonitrile, epoxies, urethanes and crosslinked polyvinyl butyral.

7. The composition as in claim 6 wherein the polyvinyl butyral coating has a weight percent in the range of about 0.3–0.6 of said copper particle.

* * * * *